United States Patent
Tsubota et al.

(10) Patent No.: US 7,158,447 B2
(45) Date of Patent: Jan. 2, 2007

(54) SONAR TRANSMITTER

(75) Inventors: Koutarou Tsubota, Tokyo (JP); Yutaka Tsubura, Tokyo (JP)

(73) Assignee: NEC Corporation, Tokyo (JP)

( * ) Notice: Subject to any disclaimer, the term of this patent is extended or adjusted under 35 U.S.C. 154(b) by 24 days.

(21) Appl. No.: 11/134,355

(22) Filed: May 23, 2005

(65) Prior Publication Data

US 2006/0077760 A1  Apr. 13, 2006

(30) Foreign Application Priority Data

May 24, 2004  (JP) ............................. 2004-153090

(51) Int. Cl.
*H04B 1/02*  (2006.01)

(52) U.S. Cl. .................................... 367/137
(58) Field of Classification Search ................ 367/137, 367/138

See application file for complete search history.

(56) References Cited

U.S. PATENT DOCUMENTS 3,900,823 A * 8/1975 Sokal et al. ................ 330/149

FOREIGN PATENT DOCUMENTS

| GB | 2 402 484 A | 12/2004 |
| JP | 9-149658 | 6/1997 |
| JP | 10-285123 | 10/1998 |
| JP | 2002-64983 | 2/2002 |
| JP | 2002-125378 | 4/2002 |
| JP | 2002-325460 | 11/2002 |

OTHER PUBLICATIONS

European Search Report dated Aug. 17, 2005.

* cited by examiner

*Primary Examiner*—Ian J. Lobo
(74) *Attorney, Agent, or Firm*—McGinn IP Law Group, PLLC

(57) ABSTRACT

Provided is a sonar transmitter in which the structure is simplified and the power loss is decreased. A sonar transmitter comprises: a load unit having a transformer constituted with a primary wiring and a secondary wiring, and a wave transmitter to which the secondary voltage generated in the secondary wiring is applied; a control unit for outputting a PWM signal which originally has no offset voltage; and a transmission circuit unit which amplifies the PWM signal outputted from the control unit and applies it to the primary wiring as the primary voltage. The control unit comprises a memory circuit formed by ROM or RAM which stores a transmission signal waveform and a control circuit formed by a microcomputer or DSP, for example. With the present invention, a conventional feedback circuit, an adder and the like become unnecessary by outputting the PWM which originally contains no offset voltage.

7 Claims, 6 Drawing Sheets

FIG. 2 PRIOR ART
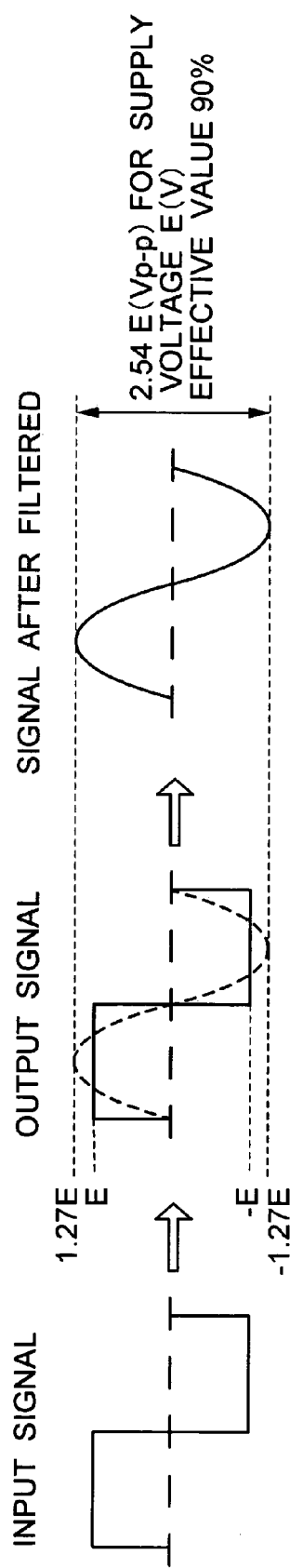
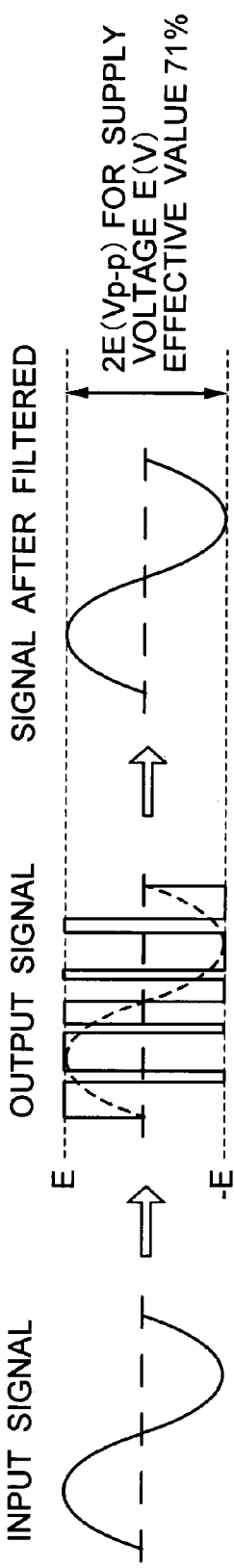

SONAR TRANSMITTER

BACKGROUND OF THE INVENTION

1. Field of the Invention

The present invention relates to a sonar transmitter which is used underwater or on the water and, more specifically, to a sonar transmitter comprising a class D power amplifier.

2. Description of the Related Art

General audio power amplifiers can be classified into two types, i.e. linear amplifiers and class D power amplifiers. The linear amplifier is currently the main stream since it can attain high quality by a simple structure though its power conversion efficiency is bad in principle. On the contrary, the class D power amplifier in a pulse-system has advantages over the linear amplifier that it has lower power consumption, can be reduced in size, and has less generation of heat, etc. Therefore, it is expected to put PWM amplifiers into practical use for the future digital sound system.

The operation of a PWM (Pulse Width Modulation) amplifier as typical conventional class D power amplifier is as follows. First, an analog input signal and a triangular wave having a radio frequency of ten times or more of that of the analog input signal is compared by a voltage comparator so as to generate a PWM signal having the duty ratio which is determined in accordance with the amplitude of the analog input signal. The PWM signal switches power amplifying stages constituted with power MOSFET and the like being connected to positive and negative power sources. Then, the output signal of the power amplifying stage is let through a lowpass filter which has a low-resistant inductor as a structural element so as to impede the triangular high-frequency component. Thereby, the audio low-frequency component is extracted. This becomes the output signal of the PWM amplifier and drives a speaker.

Meanwhile, the class D power amplifiers in PWM system are used in sonar transmitters. FIG. 1 is a block diagram for showing a conventional sonar transmitter which uses the class D power amplifier. Explanation will be provided by referring to the drawing.

A conventional sonar transmitter 100 comprises: a load unit 70 having a transformer 73 constituted with a primary wiring 71 and a secondary wiring 72, and a wave transmitter 74 to which a secondary voltage generated in the secondary wiring 72 is applied; a control unit 80 for outputting a PWM signal; and a transmission circuit unit 90 which amplifies the PWM signal outputted from the control unit 80 and applies it to the primary wiring 71 as a primary voltage. The control unit 80 and the transmission circuit unit 90 correspond to the class D power amplifier.

Between the transformer 73 and the wave transmitter 74, a coil 75 is connected for offsetting a capacitance component C of the wave transmitter 74 with an inductance component L. The transformer 73 aligns the output side of the transmission circuit unit 90 with a resistance component R of the wave transmitter 74. The wave transmitter 74 generates a sonic wave 76 in the water.

The transmission circuit unit 90 comprises a power switching circuit 91 composed of a plurality of power switching devices and a drive circuit 92 for driving those power switching devices.

The control unit 80 comprises: a memory circuit 81 formed with a ROM or RAM for storing a sine waveform 87; a feedback circuit 82 which extracts offset voltage from the output voltage of the power switching circuit 91; an adder 83 which adds an inverting component of the offset voltage outputted from the feedback circuit 82 and the sine waveform 87 outputted from the memory circuit 81; and a PWM waveform generating circuit 84 which generates the PWM signal from the result of the comparison between the sine wave outputted from the adder 83 and the triangular wave. The feedback circuit 82 is a lowpass filter, for example. Furthermore, the PWM waveform generating circuit 84 comprises a triangular wave generator 85 for generating the triangular wave and a comparator 86 for comparing the sine wave with the triangular wave.

Re: Japanese Patent Unexamined Publication No. 10-285123

Conventionally, a switching system by a rectangular wave of the transmission frequency (referred to as "transmission frequency switching system" hereinafter) is also used in the sonar transmitter in addition to using the above-described switching system by the PWM waveform (referred to as "PWM system" hereinafter). The transmission frequency switching system uses the rectangular wave with constant amplitude so that it can only change the frequency and the transmission level cannot be controlled. Thus, it cannot be used for transmission such as FM (Frequency Modulation) and the like, which requires a constant frequency band. The reason is that the impedance in the transmitter changes by each frequency so that overcurrent is generated at a frequency by which the impedance becomes low if the transmission level cannot be controlled.

On the other hand, although the conventional PWM system transmission can easily change the transmission level through the duty ratio, the transmission output is decreased compared to the transmission frequency switching system due to deterioration of the voltage use efficiency and an increase in the loss. Specifically, the theoretical voltage use efficiency (effective value) of the sine wave as the transmission waveform in the transmission frequency switching system is 90% as shown in FIG. 2, i.e. $4/(\Pi\sqrt{2})$. On the contrary, as shown in FIG. 2, it is 71%, i.e. $1/\sqrt{2}$ in the PWM system so that the voltage use efficiency deteriorates when using the PWM system. Further, the number of switching is increased in the PWM system compared to the transmission frequency switching system. Therefore, the switching loss is increased thereby decreasing the transmission power, which causes an increase in heat radiation. Thus, a heat radiation mechanism such as a heat sink becomes large-scaled.

Further, as shown in FIG. 1, the PWM system sonar transmitter 100 uses the transformer 73 between the transmission circuit unit 90 and the wave transmitter 74 for achieving the alignment with the resistance component R of the wave transmitter 74. Thus, there generates an offset voltage when switching the power switching circuit 91. There may be cases where the offset voltage excites with the direct current the transformer 73 on the primary wiring 71 side and causes the magnetic saturation thereby damaging the power switching devices. For this, it is necessary to provide the feedback circuit 82 so as not to generate the offset voltage, which complicates the circuit.

Now, described is the reason why the offset voltage is generated when using the transformer. If the primary side of the transformer is a sine waveform, the area on + side and the area on − side of the sine waveform become equal, so that the + flux line amount and − flux line amount in a core (iron core) become equal as well. Meanwhile, if the primary side of the transformer is the PWM waveform, the area on + side and the area on − side of the PWM waveform become slightly different since an error is contained at the time of modulation according to a comparison between the sine wave and the triangular wave. As a result, the offset voltage is generated on the primary side of the transformer. The offset voltage is the direct current so that the power switching devices may be damaged when a large amount of current is flown to the primary side of the transformer. For aligning the high-impedance of the wave transmitter with the low-impedance of the power amplifier, the transformer becomes essential.

SUMMARY OF THE INVENTION

An object of the present invention is to provide a sonar transmitter which achieves the simplified structure and reduction of power loss. In other words, the object of the present invention is to achieve transmission by the optimum transmission system for each frequency, i.e. PWM system is used in a frequency band where it requires control of the transmission signal waveform according to the load impedance of the known wave transmitter, and transmission frequency switching system is used in a frequency band where it can transmit the maximum transmission output with high efficiency.

The sonar transmitter according to the present invention comprises a load unit having a wave transmitter for transmitting a sonic wave and a transformer for making alignment with a resistance component of the wave transmitter, a control unit for outputting a transmission signal as a digital waveform signal, and a transmission circuit unit which amplifies the digital waveform signal from the control unit and applies it to the transformer, wherein: the control unit stores a transmission signal as a digital waveform signal and outputs the stored digital waveform signal as the transmission signal; and the transmission signal includes a PWM signal which has no offset voltage and a rectangular signal in which a duty ratio of the PWM signal is altered (Claim 1).

The present invention uses a transformer for making alignment with the resistance component of the wave transmitter. In this case with the related art, a feedback circuit, an adder and the like are provided for canceling offset voltage which is generated in the output voltage of the transmission circuit unit. On the contrary, the conventionally used feedback circuit, adder and the like become unnecessary in the present invention by outputting the PWM signal which originally has no offset voltage.

In order to output the PWM signal which originally has no offset voltage, for example, a high-level time and a low-level time within a specific time are equalized (Claim 2). More specifically, the PWM signal is generated according to a result of a comparison between a sine wave of a digital signal and a triangular wave of a digital signal and also the high-level time and the low-level time in one cycle of the sine wave are equalized (Claim 3).

The control unit may output the PWM signal or a rectangular wave signal of a transmission frequency; and the transmission circuit unit may amplify the PWM signal or the rectangular wave signal outputted from the control unit and apply it to the primary wiring as a primary voltage (Claim 4).

Outputting the PWM waveform which originally has no offset voltage by equalizing the high-level time and the low-level time within a specific time enables to easily output the transmission frequency rectangular wave signal by simply setting the duty ratio to be 50% at all times. In other words, it enables to execute the transmission frequency switching system easily.

At this time, the control unit may output either the PWM signal or the rectangular wave signal in accordance with a frequency band of the transmission frequency (Claim 5) or may output the PWM signal in the frequency band where overcurrent is generated in the load unit when the rectangular wave signal is outputted (Claim 6). In this case, the PWM system is employed in the frequency band where overcurrent is generated in the load unit so as to prevent generation of the overcurrent, while the transmission frequency switching system is employed in the frequency band where there is no overcurrent generated in the load unit for achieving high efficiency.

Furthermore, it may further comprise an impedance detection unit for detecting impedance of the wave transmitter at a time of transmission, wherein the control unit judges that there is overcurrent to be generated in the load unit by outputting the rectangular wave signal when the impedance detected by the impedance detection unit is a specific value or less under the frequency of the transmission (Claim 7). In this case, the PWM system and the transmission frequency switching system can be switched more appropriately.

In short, the configuration of the present invention may be described as follows.

1. A PWM system transmitter having a non-feedback system to be used for a sonar transmitter.

2. A transmitter using a waveform generating method which achieves no feedback of circuit by equalizing the bit numbers of "1" (HIGH) and "0" (LOW) in the PWM waveform in a specific transmission width by a computable device such as a PC (Personal Computer) or DSP (Digital Signal Processor).

3. A transmitter using a waveform control method, which enables to perform transmission using the transmission frequency switching system in the frequency band where the transmission frequency switching system is effective and using the PWM system in the frequency band where the PWM system is effective by corresponding to the impedance which changes in accordance with the frequency through a use of a class D power amplifier which can execute both the PWM system and the transmission frequency switching system when performing FM transmission or the like which has a specific frequency band.

The effect of these configurations will be described.

1. The feedback circuit used in the conventional PWM system transmitter becomes unnecessary by using the waveform generating method of the present invention in which the bit numbers of "1" (HIGH) and "0" (LOW) of the PWM waveform as the transmission waveform are made consistent in advance by computation so as not to generate the offset voltage of the transformer. Furthermore, conventionally, it is necessary to make the transmission signal in the ROM or RAM into the sine wave for performing adding processing between the feedback waveform. On the contrary, the present invention enables to form the transmission signal waveform by "1" and "0", having the same structure as the transmission frequency switching system which is conventionally formed by "1" and "0". Thus, it becomes possible to perform both the PWM system and the transmission frequency switching system by the same circuit.

2. Conventionally, in the apparatus for FM transmission in which the electric power needs to be controlled, transmission is performed by the PWM system over the entire frequency band. Thus, the transmission output is restricted even in the frequency band where transmission can be achieved by the transmission frequency switching system. Use of the waveform control method of the present invention enables to transmit the maximum output with the high efficiency in the frequency band where transmission can be performed by the transmission frequency switching system.

3. In the non-feedback system of the present invention, the transmission waveform data of "1" and "0" can be stored in a ROM or RAM. Therefore, an adder, a comparator, and a triangular wave generator used conventionally for generating the PWM waveform become unnecessary thereby enabling to reduce the size of the circuit.

Furthermore, the present invention can be summarized as follows. The conventional sonar transmitter has selectively been used as follows. An apparatus only for PCW transmission employs a transmission frequency switching system which is a conventional class D transmitter. An apparatus which requires FM transmission uses the PWM system transmitter which can control the maximum transmission output so as to prevent overcurrent due to a decrease in the impedance of a wave transmitter caused by the frequency sweep. Thus, an object is to enable the same transmission output as that of PCW (Pulsed Continuous Wave) even in the apparatus for performing FM transmission without deteriorating the transmission output, and to improve the complication of the circuit, which is a drawback of the PWM system, and an increase in the power loss of the power switching devices which is generated due to the switching performed at the frequency of ten times the transmission frequency or more. That is, it enables reduction of the size and also the optimum transmission by achieving non-feedback system transmitter by the waveform generating method which enables non-feedback and by interchangeably using the PWM system and the transmission frequency switching system in accordance with a change of the impedance of the wave transmitter.

In the sonar transmitter according to the present invention, the PWM signal which originally has no offset voltage is outputted when using the transformer for making alignment with a resistance component of a wave transmitter. Thus, the conventional structure for feedback and canceling the offset voltage becomes unnecessary thereby simplifying the configuration.

When equalizing the high-level time and low-level time within a specific time so as to output the PWM signal which originally has no offset voltage, the rectangular wave signal of the transmission frequency can be easily outputted by simply setting the duty ratio to be 50%. Thus, the transmission frequency switching system can be easily executed. At this time, generation of the overcurrent can be prevented by employing the PWM system in the frequency band where overcurrent is generated in the load unit and also the high efficiency can be achieved by employing the transmission frequency switching system in the frequency band where there is no overcurrent generated in the load unit. Further, by detecting the impedance of the wave transmitter at the time of transmission, the PWM system and the transmission frequency switching system can be switched more appropriately.

In other words, with the non-feedback system transmitter of the present invention, the feedback circuit, the triangular wave generator and the comparator in the conventional PWM system transmitter become unnecessary. Thus, the number of circuits can be reduced and the size can be minimized. Furthermore, with the waveform generating method and the non-feedback system transmitter of the present invention, compared to the conventional PWM system, it is possible to increase the maximum transmission output at the time of the frequency sweep such as FM transmission. In addition, heat loss quantity due to the switching loss can be decreased so that the size of the heat sink can be reduced. Moreover, with the transmitter having functions of both the PWM system and the transmission frequency switching system, there is no frequency band where the overcurrent is generated even when the load impedance becomes low due to the sweep of the frequency. Thus, it is possible to achieve FM transmission of the maximum level.

BRIEF DESCRIPTION OF THE DRAWINGS

FIG. 2 is a waveform diagram for showing a transmission frequency switching system and FIG. 2 is a waveform diagram for showing a PWM system;

DETAILED DESCRIPTION OF THE PREFERRED EMBODIMENTS

Figure 1:
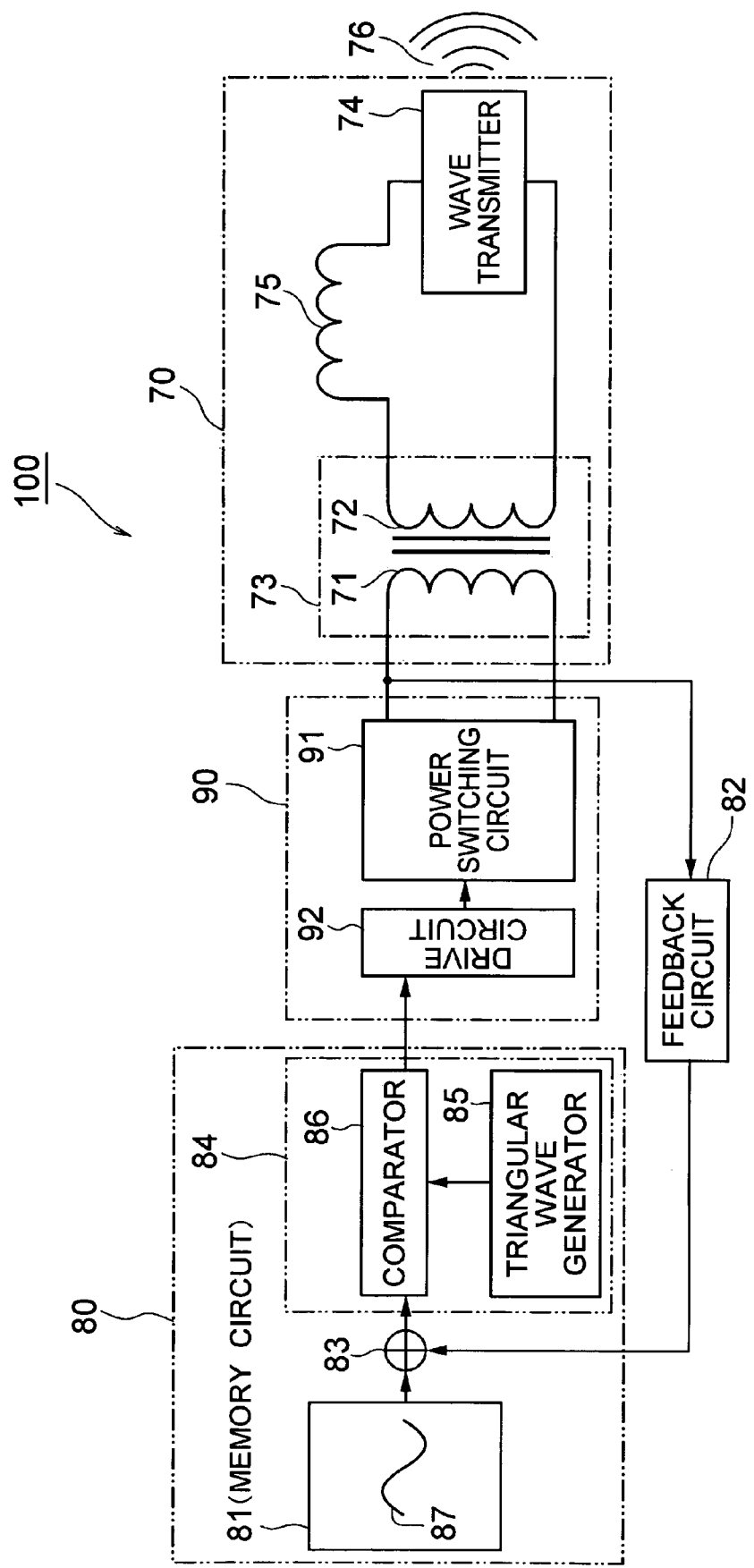
FIG. 1 is a block diagram for showing a conventional sonar transmitter.
Figure 3:
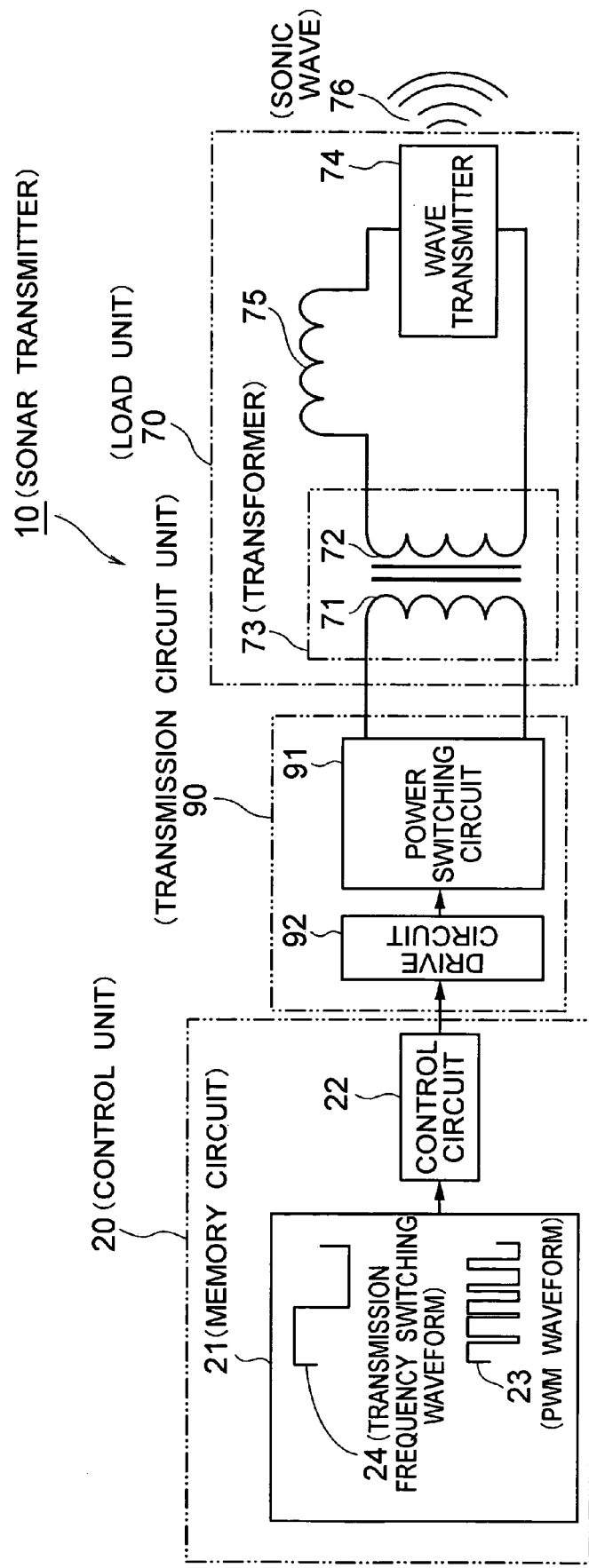
FIG. 3 is a block diagram for showing a first embodiment of a sonar transmitter according to the present invention.

FIG. 3 is a block diagram for showing a first embodiment of the sonar transmitter according to the present invention. Explanation will be provided by referring to the drawing. However, description of the same components as those of FIG. 1 will be omitted by applying the same reference numerals thereto.

A sonar transmitter 10 comprises: a load unit 70 having a transformer 73 constituted with a primary wiring 71 and a secondary wiring 72, and a wave transmitter 74 to which the secondary voltage generated in the secondary wiring 72 is applied; a control unit 20 for outputting a PWM signal which originally has no offset voltage; and a transmission circuit unit 90 which amplifies the PWM signal outputted from the control unit 20 and applies it to the primary wiring 71 as the primary voltage. The control unit 20 comprises a memory circuit 21 formed with a ROM or RAM which stores a transmission signal waveform and a control circuit 22 formed with a microcomputer or DSP, for example.

The transformer 73 is essential for achieving alignment with the resistance component R of the wave transmitter 74. In such case with the related art, offset voltage is generated in the output voltage of the transmission circuit unit 90. Thus, a feedback circuit, an adder and the like are provided for canceling the offset voltage. On the contrary, in the embodiment, the conventionally used feedback circuit, adder, etc become unnecessary by outputting the PWM signal which originally has no offset voltage. That is, the sonar transmitter 10 is of a non-feedback system.

In order to output the PWM signal which originally has no offset voltage, the high-level time and the low-level time within a specific time is set equal, for example. More specifically, the PWM signal is generated based on the result of a comparison between a sine wave of a digital signal and a triangular wave of the digital signal and also the high-level time and the low-level time at least in one cycle of the sine wave is set equal.

Further, the control unit 20 outputs a PWM waveform 23 (PWM signal) or a transmission frequency switching waveform 24 (transmission frequency rectangular wave signal). The transmission circuit unit 90 amplifies the PWM waveform 23 or the transmission frequency switching waveform 24 outputted from the control unit 20 and applies it to the primary wiring 71 as a primary voltage. Outputting the PWM waveform 23 which originally has no offset voltage by equalizing the high-level time and the low-level time within a specific time enables to easily output the transmission frequency switching waveform 24 by fixing the duty ratio to be 50%. In other words, it enables to execute the transmission frequency switching system easily.

At this time, the control unit 20 outputs either the PWM waveform 23 or the transmission frequency switching waveform 24 in accordance with the frequency band of the transmission frequency. Specifically, the PWM waveform 23 is outputted in the frequency band where the overcurrent is generated in the load unit 70 if the transmission frequency switching wave 24 is outputted. Thus, it enables to suppress generation of the overcurrent by employing the PWM system in the frequency band where the overcurrent is generated in the load unit 70 and also to achieve high efficiency by employing the transmission frequency switching system in the frequency band where there is no overcurrent generated in the load unit 70.

Figure 4:
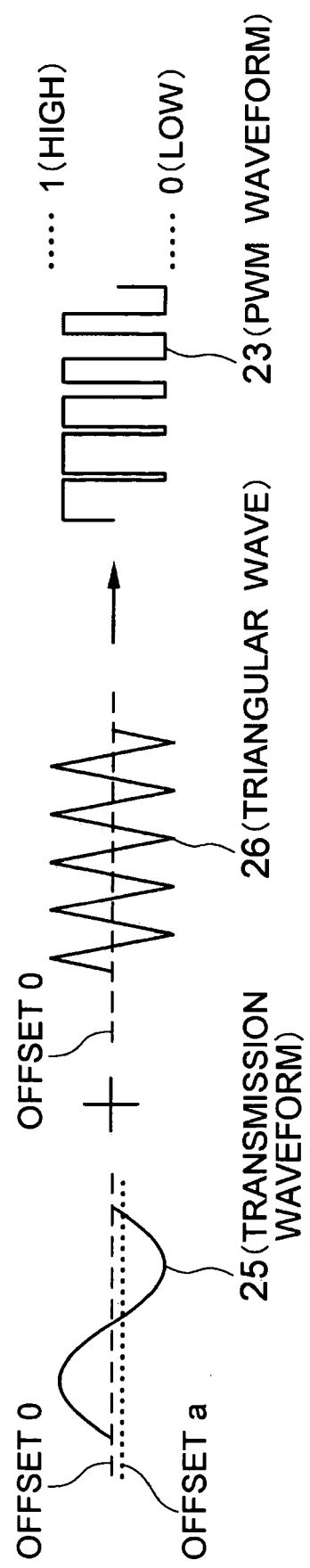
FIG. 4 is a waveform diagram for showing a waveform generating method used in the sonar transmitter of FIG. 3.

FIG. 4 is a waveform diagram for showing a waveform generating method used in the sonar transmitter 10. The waveform generating method of the sonar transmitter 10 will be described hereinafter by referring to FIG. 3 and FIG. 4.

First, described is a generating method of the PWM waveform 23 to be stored in the memory circuit 21. As shown in FIG. 4, a conventional waveform generating method in the PWM system generates the PWM waveform 23 on a substrate in real time by comparing a sine wave transmission waveform 25 and a triangular waveform 26 as the transmission signal using a comparator. On the contrary, in the embodiment, the PWM waveform 23 which is generated in advance by a computable device such as a PC is written and stored in the memory circuit 21 so as to output the PWM waveform 23 at the time of transmission.

Now, it will be described in more detail by referring to a specific example. The PWM waveform 23 is generated by comparing the transmission waveform 25 and the triangular wave 26. At this time, the offset of the triangular wave 26 is set 0 (zero) to adjust offset a of the transmission waveform 25, and the PWM waveform 23 with 0 (zero) offset is generated by a computable device such as a PC. Specifically, when the PWM waveform 23 of one second is constituted with data of 2M bits, the offset a of the transmission waveform 25 is adjusted so that the 1M bits, the half of 2M bits, becomes "1" and 1M bits as the other half becomes "0" for generating the PWM waveform 23. The control circuit 22 reads out the data of 2M bits per second from the memory circuit 21 and outputs it to the drive circuit 92 after performing data processing thereto.

The PWM waveform 23 generated in this manner as described above is transferred to the transmission circuit unit 90 after performing a waveform control such as dead time control in the control circuit 22. In the transmission circuit unit 90, the drive circuit 92 performs drive of the PWM waveform 23 for outputting it to the power switching circuit 91, and the power switching circuit 91 amplifies the transmitted waveform for transmitting it to the load unit 70 as the waveform having no offset component. In the load unit 70, through a filter formed of a series resonant circuit which comprises a inductance component L of a coil 75, a capacitance component C and the resistance component R of the wave transmitter 74, the amplified waveform as the rectangular wave becomes a sine wave and is outputted underwater from a wave transmitter 74 as a sonic wave 76.

Figure 5:
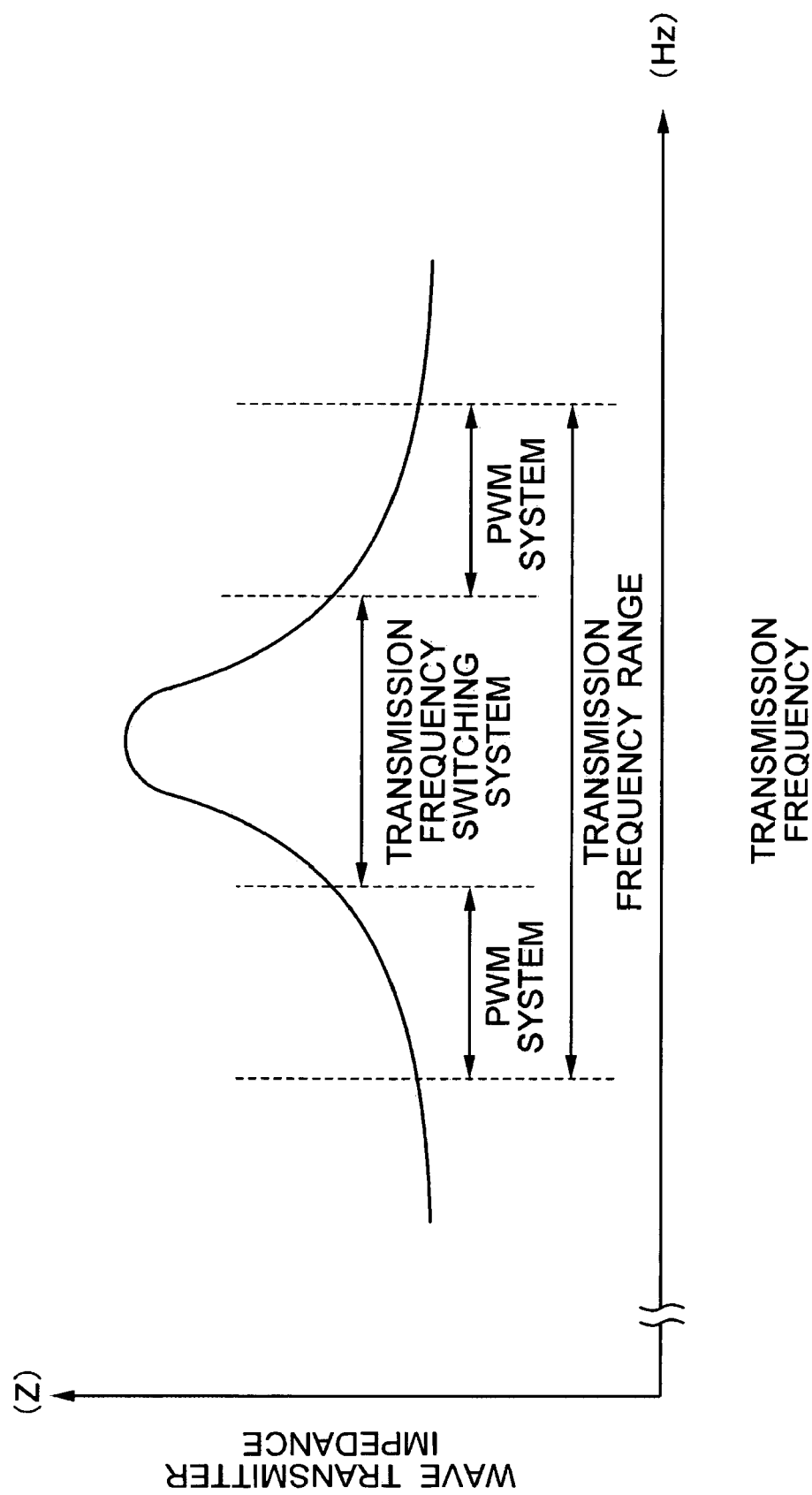
FIG. 5 is a graph for showing a waveform control method used in the sonar transmitter of FIG. 3.

FIG. 5 is a graph for showing a waveform control method used in the sonar transmitter 10. In FIG. 5, the vertical axis is the impedance of the wave transmitter 74 and the horizontal axis is the frequency of the transmission signal. The waveform control method of the sonar transmitter 10 will be described hereinafter by referring to FIG. 3 and FIG. 5.

As shown in FIG. 5, in the case of the wave transmitter with a characteristic that the impedance drastically changes according to the frequency, the transmission level for the load unit with respect to the frequency becomes constant with the conventional transmission frequency switching system transmitter. Thus, there exists a frequency band where overcurrent is generated at the time of FM transmission. Therefore, in the related art, used is the PWM system which, while exhibiting lower voltage use efficiency than the transmission frequency switching system, can prevent the overcurrent by changing the transmission level according to the frequency.

Thus, as shown in FIG. 5, the waveform control method of the embodiment uses the PWM system in the frequency band with low impedance and uses the transmission frequency switching system in the frequency band with the high impedance for enabling to increase the transmission output.

Further, unlike the transmission frequency switching system, the PWM system operates by the triangular wave frequency which is more than the transmission frequency. Thus, the number of switching in the PWM system is increased compared to the transmission frequency switching system thereby increasing the power loss as well. It is possible to decrease the power loss in the frequency band where transmission can be performed by the transmission frequency switching system by using the waveform control method of the embodiment. Therefore, it enables to reduce the size of a heat radiation mechanism such as a heat sink for releasing the heat.

Figure 6:
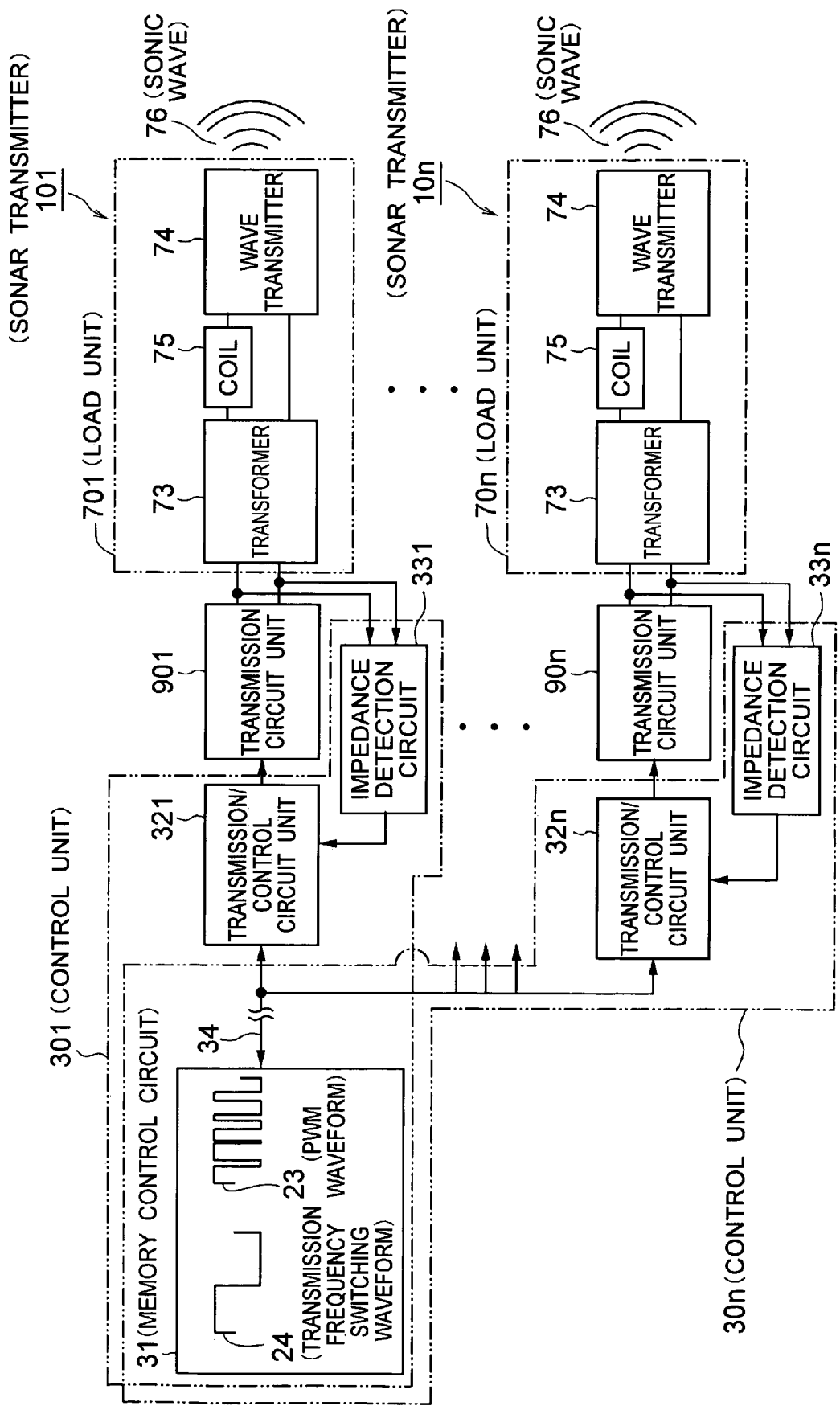
FIG. 6 is a block diagram for showing a second embodiment of the sonar transmitter according to the present invention.

FIG. 6 is a block diagram for showing a second embodiment of the sonar transmitter according to the present invention. Explanation will be provided hereinafter by referring to the drawing. However, description of the same components as those of FIG. 3 will be omitted by applying the same reference numerals thereto.

In the embodiment, n-numbers of sonar transmitters 101–10n shares a single memory control circuit 31. The sonar transmitters 101–10n all have the same structure so that only the sonar transmitter 101 will be described. The sonar transmitter 101 comprises: a load unit 701 having a transformer 73 constituted with a primary wiring 71 and a secondary wiring 72, and a wave transmitter 74 to which the secondary voltage generated in the secondary wiring 72 is applied; a control unit 301 for outputting a PWM signal which originally has no offset voltage; and a transmission circuit unit 901 which amplifies the PWM signal outputted from the control unit 301 and applies it to the primary wiring 71 as the primary voltage. The load unit 701 and the transmission circuit unit 901 have the same structures as the load unit 70 and the transmission circuit unit 90 of FIG. 1.

The control unit 301 comprises: a memory control circuit 31 constituted with a computable device (PC, DSP or the like) which stores the transmission signal waveform; a transmission/control circuit 321 which has the function of the control circuit 22 of FIG. 3 and the communication function between a memory control circuit 31; and an impedance detection circuit 322 for detecting the impedance of the wave transmitter 74 at the time of transmission; and a transmission cable 34 for connecting the memory control circuit 31 and the transmission/control circuit 321, etc.

The impedance detection circuit 322, for example, is formed with a voltage sensor and a current sensor for detecting the output voltage and the output current of the transmission circuit unit 901. For example, when the impedance of the wave transmitter 74 detected by the impedance detection circuit 322 under the frequency at the time of the transmission is a specific value or lower, the control unit 301 judges that there is overcurrent to be generated in the load unit 701 if the transmission frequency switching waveform 24 is outputted. With this, the PWM system and the transmission frequency switching system can be switched more appropriately.

It will be described in more detail. The memory control circuit 31 transmits the transmission signal waveform of the rectangular wave to the transmission/control circuit 321 through the transmission cable 34. The non-feedback system transmission circuit unit 901 amplifies the transmitted transmission signal waveform and outputs it to the load unit 701 thereby the sonic wave 76 is transmitted from the load unit 701. Further, the impedance detection circuit 331 detects the impedance of the wave transmitter 74 at the time of transmission and transmits the data to the memory control circuit 31 through the transmission/control circuit 321 and the transmission cable 34. Thereby, it is fed back as the computing data for the next transmission waveform.

The distinctive feature of this embodiment with respect to the first embodiment is that the function of the memory circuit 21 of the first embodiment as shown in FIG. 3 to store the transmission signal is included in a program of PC or DSP of the memory control circuit 31. Thus, it is possible to change the transmission signals of various types as desired by an operator by each transmission and to generate the optimum transmission signal level within the PC or DSP in accordance with the circumstances. Furthermore, by combining a single memory control circuit 31, a single transmission cable 34, and a large number of transmission circuit units 901–90n and the load units 701–70n, it enables to control a large number of wave transmitters 74 simultaneously so as to perform transmission.

What is claimed is:

1. A sonar transmitter, comprising
   a load unit having a wave transmitter for transmitting a sonic wave and a transformer for making alignment with a resistance component of the wave transmitter,
   a control unit for outputting a transmission signal as a digital waveform signal, and
   a transmission circuit unit which amplifies the digital waveform signal from the control unit and applies it to the transformer, wherein:
   the control unit stores the transmission signal as the digital waveform signal and outputs the stored digital waveform signal as the transmission signal; and
   the transmission signal includes a PWM signal which has no offset voltage and a rectangular signal in which a duty ratio of the PWM signal is altered.

2. The sonar transmitter according to claim 1, wherein the control unit stores the PWM signal which has no offset voltage by equalizing a high-level time and a low-level time within a specific time.

3. The sonar transmitter according to claim 1, wherein the control unit stores the PWM signal with no offset voltage, which is generated according to a result of a comparison between a sine wave of a digital signal and a triangular wave of the digital signal and also by equalizing a high-level time and a low-level time in one cycle of the sine wave.

4. The sonar transmitter according to claim 2, wherein:
   the control unit outputs the PWM signal or a rectangular wave signal of a transmission frequency; and
   the transmission circuit unit amplifies the PWM signal or the rectangular wave signal outputted from the control unit and applies it to the primary wiring as a primary voltage.

5. The sonar transmitter according to claim 4, wherein the control unit outputs either the PWM signal or the rectangular wave signal in accordance with a frequency band of the transmission frequency.

6. The sonar transmitter according to claim 5, wherein the control unit outputs the PWM signal in the frequency band where overcurrent is generated in the load unit when the rectangular wave signal is outputted.

7. The sonar transmitter according to claim 6, further comprising an impedance detection unit for detecting impedance of the wave transmitter at a time of transmission, wherein
   the control unit judges that there is overcurrent to be generated in the load unit by outputting the rectangular wave signal when the impedance detected by the impedance detection unit is a specific value or less under the frequency of the transmission.

* * * * *